US011271367B1

(12) United States Patent
El-Tawil et al.

(10) Patent No.: US 11,271,367 B1
(45) Date of Patent: Mar. 8, 2022

(54) METHOD TO FORM A SELF-ALIGNED EVAPORATED METAL CONTACT IN A DEEP HOLE AND VCSEL WITH SUCH CONTACT

(71) Applicant: II-VI OptoElectronic Devices, Inc., Warren, NJ (US)

(72) Inventors: Omar Husam Amer El-Tawil, North Brunswick, NJ (US); Kevin Chi-Wen Chang, West Windsor, NJ (US)

(73) Assignee: II-VI Delaware, Inc., Wilmington, DE (US)

( * ) Notice: Subject to any disclaimer, the term of this patent is extended or adjusted under 35 U.S.C. 154(b) by 0 days.

(21) Appl. No.: 14/958,389

(22) Filed: Dec. 3, 2015

Related U.S. Application Data

(60) Provisional application No. 62/088,259, filed on Dec. 5, 2014.

(51) Int. Cl.
*H01S 5/183* (2006.01)
*H01S 5/042* (2006.01)

(52) U.S. Cl.
CPC ........ *H01S 5/18347* (2013.01); *H01S 5/0425* (2013.01); *H01S 2304/02* (2013.01)

(58) Field of Classification Search
CPC ......... H01L 21/02345–02354; H01L 21/0272; H01L 21/28; H01L 21/283–28593; H01L 21/311–31144; H01S 5/0425; H01S 5/18347; H01S 2304/02
See application file for complete search history.

(56) References Cited

U.S. PATENT DOCUMENTS

| | | | | |
|---|---|---|---|---|
| 4,004,044 A | * | 1/1977 | Franco | G03F 7/094 148/DIG. 106 |
| 4,536,942 A | * | 8/1985 | Chao | H01L 21/0272 148/DIG. 143 |
| 4,981,809 A | * | 1/1991 | Mitsuaki | H01L 21/0271 148/DIG. 133 |
| 5,642,373 A | * | 6/1997 | Kamizato | H01S 5/42 257/88 |
| 5,652,451 A | * | 7/1997 | Andoh | H01L 21/28587 257/330 |
| 5,696,035 A | * | 12/1997 | Kitano | H01L 21/28587 252/79.4 |
| 6,259,715 B1 | * | 7/2001 | Nakayama | H01S 5/423 372/50.1 |

(Continued)

*Primary Examiner* — Minsun O Harvey
*Assistant Examiner* — Sean P Hagan
(74) *Attorney, Agent, or Firm* — Wendy W. Koba

(57) ABSTRACT

A method for forming a metal contact in a deep hole in a workpiece. A first hole is formed that extends from the upper surface of the workpiece to a substrate at the bottom of the hole. The hole is then filled with photoresist. Next, a photolithographic process is performed to create a second hole within the photoresist and to expose the substrate; and a wet etch is performed to remove a portion of the substrate. A layer of contact metal is then deposited on the surface of the photoresist. In the second hole, the metal layer is formed on the exposed surface of the substrate and on discontinuous portions of the photoresist on the sidewalls. A liftoff process is then used to remove the photoresist and the metal deposited on the photoresist while leaving the metal at the bottom of the second hole in contact with the substrate.

11 Claims, 4 Drawing Sheets

(56) References Cited

U.S. PATENT DOCUMENTS

| | | | | |
|---|---|---|---|---|
| 6,656,802 B2 * | 12/2003 | Oszustowicz | ..... | H01L 21/28587 |
| | | | | 257/E21.407 |
| 6,720,200 B2 * | 4/2004 | Yamaguchi | ....... | H01L 21/28587 |
| | | | | 257/E21.222 |
| 2011/0086452 A1 * | 4/2011 | Johnson | .............. | H01S 5/18308 |
| | | | | 438/29 |
| 2015/0139260 A1 * | 5/2015 | Gerlach | .............. | H01S 5/18341 |
| | | | | 372/50.11 |

* cited by examiner

METHOD TO FORM A SELF-ALIGNED EVAPORATED METAL CONTACT IN A DEEP HOLE AND VCSEL WITH SUCH CONTACT

CROSS REFERENCE TO RELATED APPLICATION

This application claims benefit of provisional application Ser. No. 62/088,259, filed Dec. 5, 2014, which application is incorporated by reference herein in its entirety.

BACKGROUND

In semiconductor manufacturing, in microelectronic mechanical systems (MEMS), and in other nanotechnology applications, there frequently is a need to form a metal contact at the bottom of a relatively deep hole. Unfortunately, the dimensions of the hole and, in particular, its very small size and its high aspect ratio (hole depth to hole diameter) often present challenges to forming good contacts at acceptable yields. For example, the sidewalls of the hole often create shadowing effects on the surface at the bottom of the hole where the contact is to be formed; and these effects often limit the size or the quality of the contact that can be formed. These challenges are often exacerbated if the hole is formed in a multi-layered structure such as a series of epitaxially grown layers. Such layers are found, for example, in a distributed Bragg reflector (DBR) in a vertical cavity surface emitting laser (VCSEL).

SUMMARY

This invention is a method for forming a metal contact in a relatively deep hole in a workpiece. In an illustrative embodiment, a first hole is formed in the workpiece at a desired location. The first hole extends from the upper surface of the workpiece to a substrate at the bottom of the hole. The first hole is then filled with photoresist by coating the upper surface of the workpiece with a layer of photoresist. Next, a photolithographic process is performed to create a second hole within the photoresist on the sidewalls of the first hole and to expose the substrate at the bottom of the second hole, A wet etch is then performed to remove a portion of the substrate at the bottom of the second hole and to undercut some of the photoresist remaining at the bottom of the second hole. Next, a layer of contact metal is deposited on the surface of the photoresist. This layer is a continuous layer except where the second hole is formed. In the second hole, the metal layer is formed on the exposed surface of the substrate and on discontinuous portions of the photoresist on the sidewalls. A liftoff process is then used to remove the photoresist and the metal that was deposited on the photoresist while leaving the metal at the bottom of the second hole in contact with the substrate.

Advantageously, the foregoing method may be practiced to make a VCSEL in which an ohmic contact to the substrate is made through a hole in the epitaxial layers of a DBR.

BRIEF DESCRIPTION OF DRAWING

These and other objects, features and advantages of the invention will be more readily apparent from the following detailed description in which.

DETAILED DESCRIPTION

Figure 1:
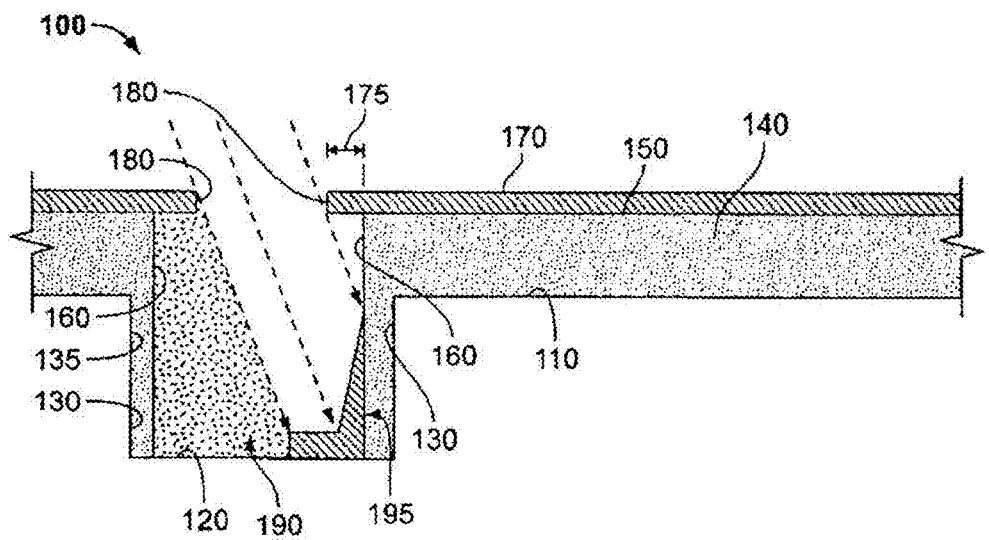
FIG. 1 is a cross-section depicting illustrative problems that may be encountered when forming metal layers in relatively deep holes in workpieces such as semiconductor structures.

FIG. 1 is a cross-section illustrating certain problems that may be encountered when forming an evaporated metal layer at the bottom of a relatively deep hole in a semiconductor structure or other nanostructure. FIG. 1 depicts a workpiece 100 having an upper surface 110 in which there is a first hole 130 that extends downward from the upper surface to a lower surface 120. Hole 130 has sidewalls 135 in workpiece 100. A layer 140 of photoresist covers upper surface 110 of the workpiece and sidewalls 135 of hole 130. The layer of photoresist also has a second bole 160 that is centered in hole 130 and extends from an upper surface 150 of the photoresist to lower surface 120 of the workpiece. A mask 170 covers the upper surface of the layer of photoresist except for a third hole 180 above second hole 160 in the photoresist. The mask includes an overhang 175 that extends over a portion of second hole 160.

As shown in FIG. 1, when a metal layer is evaporated onto the lower surface of the hole to form a metal contact, the sidewalls of the hole often create shadowing effects 190 on the surface at the bottom of the hole. These effects often limit the size or the quality of the contact that can be formed. The overhang 175 of the mask may also contribute to these shadowing effects. Conversely, if the overhang is not great enough, metal stringers 195 may form on the sidewalls of the hole, Such stringers also impair the quality of the metal contact.

Figure 2:
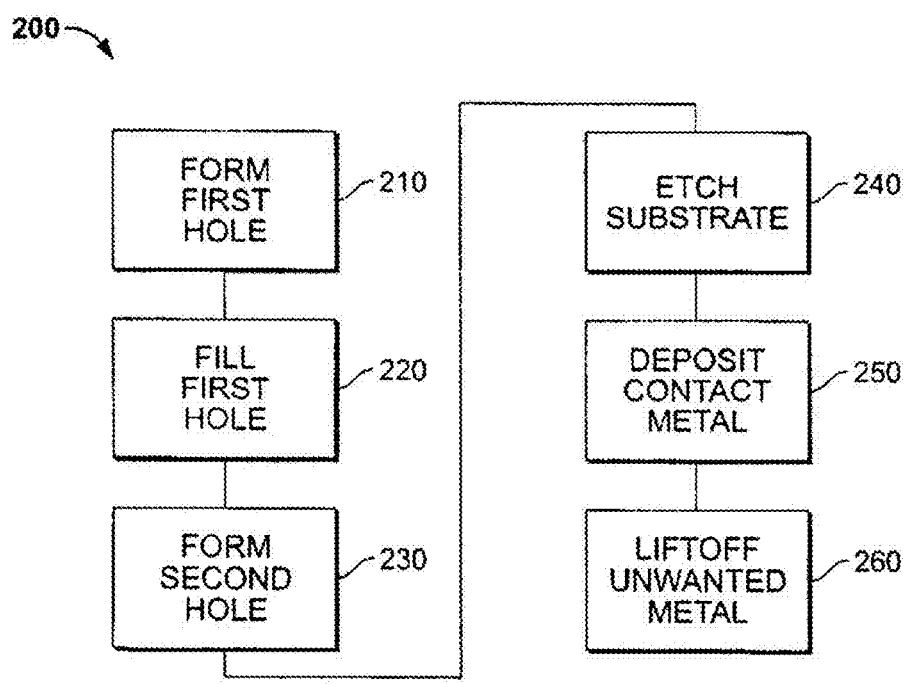
FIG. 2 is a flow chart depicting the steps in an illustrative embodiment of the method of the present invention.

FIG. 2 is a flow chart depicting an illustrative embodiment of a method 200 for forming a metal contact that alleviates these problems of, for example, the size of the metal contact and its quality (quality in this case related to the elimination of metal stringer formation on sidewalls). For convenience of description, the method will first e described for the case of formation of a metal contact at the bottom of a hole in a generic workpiece. Examples of the formation of a contact at the bottom of the hole in a VCSEL will then be provided in FIGS. 3-9.

Method 200 begins at step 210 as a first hole is formed at a desired location in a workpiece. The first hole extends from an upper surface of the workpiece to a substrate at the bottom of the hole. At step 220, the first hole is filled with photoresist by coating the upper surface of the workpiece to a substrate at the bottom of the hole. At step 230, a photolithographic process is then performed to create a second, smaller hole through the photoresist covering the first hole and expose the substrate at the bottom of the second hole. Illustratively, the photolithographic process includes the placement on the photoresist of a mask that defines selected portions of the photoresist that are to be removed in a central area of the first hole, followed by selective exposure of the photoresist by actinic radiation directed through the mask, and removal of the selected portions of the photoresist.

Figure 5:
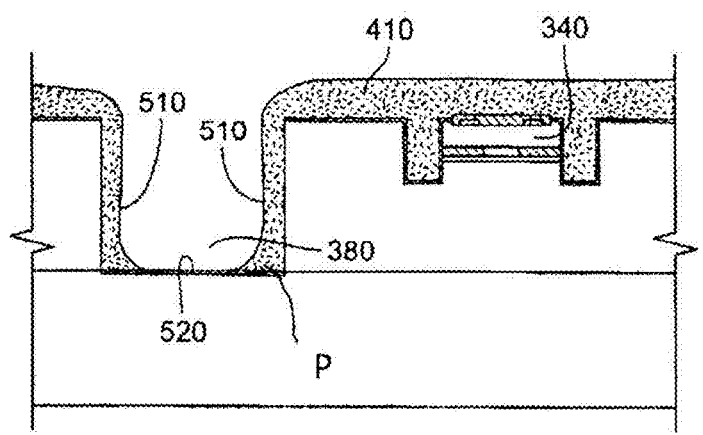
Figure 6:
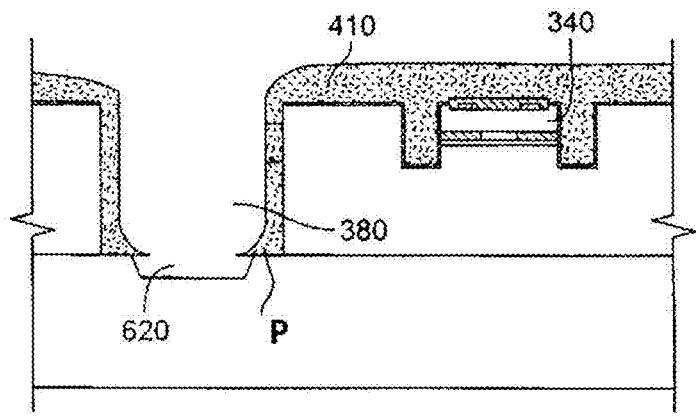
Figure 7:
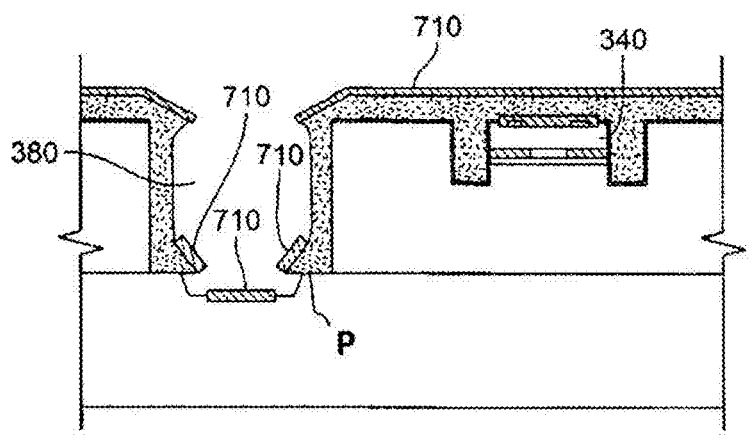

A wet etch is then performed at step 240 to remove a portion of the substrate at the bottom of the second hole and to undercut some of the photoresist covering an outer perimeter of the first hole, this photoresist perimeter labeled as "P" in FIGS. 5-7. Next, at step 250, a layer of contact metal is deposited on the surface of the photoresist. This layer is a continuous layer except where the second hole is formed. In the second hole, the metal layer is formed on the exposed surface of the substrate and on photoresist perimeter P. A liftoff process is then performed at step 260 to remove the photoresist and the metal that was deposited on the photoresist while leaving the metal at the bottom of the second hole in contact with the substrate. In accordance with the method of the present invention, therefore, the photoresist remaining on the sidewalls of the first hole will prevent the deposited metal from contacting the sidewalls, thereby eliminating the possibility of forming metal stringers in the inventive process.

Figure 3:
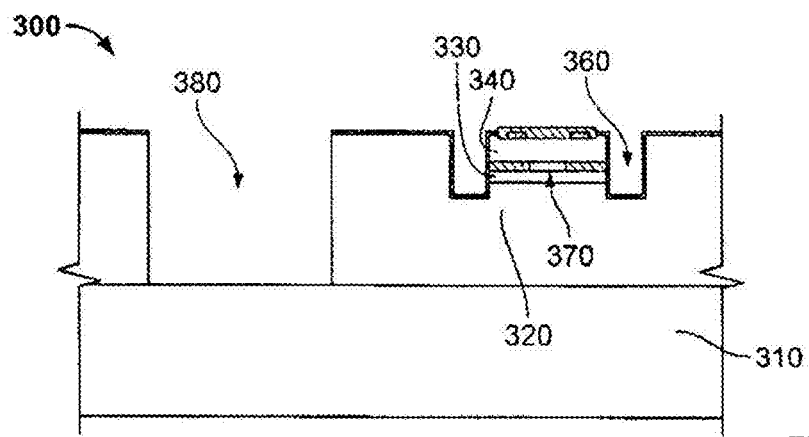
FIGS. 3-8 are cross-sections depicting the formation of a metal contact at the bottom of a hole in a VCSEL formed in accordance with the illustrative embodiment of FIG. 2.

FIGS. 3-8 are cross-sections of a hole depicting the formation of the metal contact in accordance with the steps of FIG. 2. Illustratively, these steps are performed in a series of epitaxially grown layers such as found in a distributed Bragg reflector (DBR) in a vertical cavity surface emitting lasers (VCSEL). FIG. 3 depicts an illustrative embodiment 300 of a VCSEL comprising a substrate 310, a first distributed Bragg reflector (DBR) 320 on a first major surface of the substrate, an active region 330 on the first DBR, and a second DBR 340 on the active region. Each DBR is a set of alternating, layers of two semiconductor materials having different indices of refraction with each layer having a thickness of one quarter the operating wavelength of the VCSEL. Optical interference between the radiation reflected at the interface between successive layers makes each DER a highly effective reflector. DBRs 320 and 340 form a laser cavity; and when a suitable current is established through the VCSEL, laser emission takes place.

Typically, the current is confined to a narrow region in the VCSEL by limiting the lateral dimensions of the active region and the second DBR and/or by inserting an aperture between the active region and the second DBR. In the embodiment shown in FIGS. 3-8, current confinement is achieved by forming a trench isolation region 360 around the active region and the second DBR and forming an oxide aperture 370. It will be appreciated that the alternating layers of semiconductor material extend the full width of the structure shown in FIGS. 3-8 even though the lateral dimensions of the active region and the second DBR are only a small part of the lateral extent of the first DBR.

Ohmic electrical contacts to the VCSEL are typically made to the substrate and the second DBR. This, however, is often a problem since it frequently is desirable to have the electrical leads for both contacts located on the same side of the VCSEL. To contact the substrate from the same side of the VCSEL as the second DBR, it is necessary to form a hole 380 in the epitaxial layers that extends from an upper surface of the VCSEL down to the substrate and to form a metal contact on the exposed surface of the substrate at the bottom of the hole.

Figure 4:
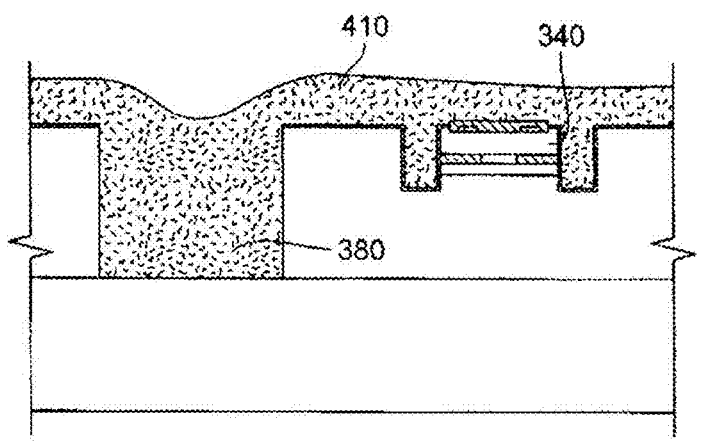
Figure 8:
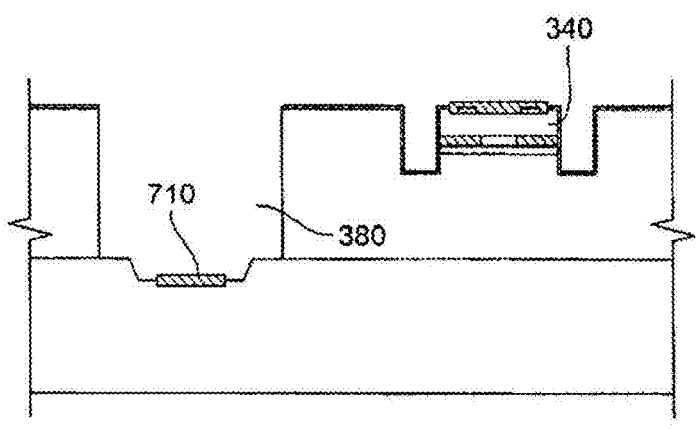

As shown in FIG. 4, the first hole is then filled with a photoresist 410 by coating the upper surface of the VCSEL with a layer of photoresist. As shown in FIG. 5, a photolithographic process is then performed to create a second, smaller diameter hole 510 through the photoresist 410 within the first hole, the second, smaller diameter hole 510 formed to expose a potion 520 of substrate 310 at the bottom of the second hole. As shown in FIG. 6, a wet etch is then performed to remove a portion 620 of the substrate at the bottom of the second hole and to undercut some of the photoresist perimeter P covering an outer region of the first hole. Next, as shown in FIG. 7, a layer of contact metal 710 is deposited on the surface of the photoresist. This layer is a continuous layer except where the second hole is formed. In the second hole, the metal layer is formed on the exposed surface 720 of the substrate and on discontinuous, non-vertical portions of the photoresist perimeter P covering the outer region of the first hole. A liftoff process is then performed that removes the photoresist and the metal that was deposited on the photoresist while leaving the metal at the bottom of the second hole in contact with the substrate as shown in FIG. 8, where as discussed above the step of maintaining the photoresist on the sidewalls of the hole until the metal is deposited prevents metal stringers from forming along the sidewalls (and occurred in prior art processes). An electrical lead is then formed in the hole to connect to the metal; and another ohmic contact (not shown) is formed on the second DBR.

Figure 9:
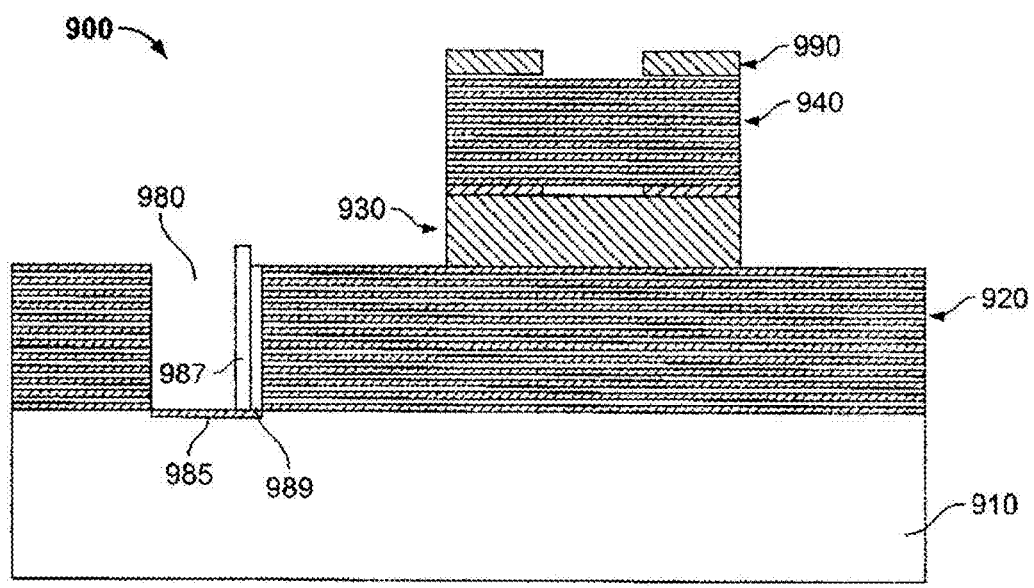
FIG. 9 is a cross-section of a second VCSEL formed in accordance with an illustrative embodiment of the invention.

FIG. 9 depicts a second illustrative embodiment of a vertical cavity surface emitting laser (VCSEL) 900. VCSEL 900 comprises a substrate 910, a first distributed Bragg reflector (DBR) 920 on a first major surface of the substrate, an active region 930 on the first DBR, and a second DBR 940 on the active region. Illustratively, these elements are shaped in a so-called mesa or air-post configuration with the lateral dimensions of the active region, second DBR and second ohmic contact being appreciably smaller than the lateral dimensions of the first DBR and substrate.

To contact substrate 910 from the same side of the VCSEL as the connection to second DBR 940, a hole 980 is formed in the epitaxial layers of the first DBR on the portion of the first DBR that is not covered by the active region and second DBR. Hole 980 extends from an upper surface of the first DBR down to substrate 910 and a metal layer 985 makes ohmic contact to the exposed surface of the substrate at the bottom of the hole. An electrical lead 987 extends through the hole to connect to metal layer 985. Lead 988 is electrically insulated from the epitaxial layers of first DBR 920 by a suitable insulating layer 989. A second metal layer 990 makes an ohmic contact with second DBR 940.

Hole 980 and metal layer 985 may be formed using the same steps as described in conjunction with FIG. 2.

As will be apparent to those skilled in the art, numerous variations may be practiced within the spirit and scope of the present invention.

What is claimed is:

1. A method for forming an evaporated metal contact in a hole in a workpiece comprising:

forming a first hole through a plurality of layers in the workpiece to expose an underlying substrate;

depositing a photoresist material over a top major surface of the workpiece, the photoresist material also filling the first hole;

removing some of the photoresist material to form a second, smaller diameter hole within the first hole in which a portion of a substrate is exposed at the bottom of the second hole while leaving photoresist material as a covering on an outer perimeter region of the first hole;

etching the exposed substrate at the bottom of the second smaller hole formed within the first hole, the etching to remove a portion of the substrate and to undercut some of the photoresist material covering the outer perimeter region of the first hole;

depositing a layer of contact metal on the photoresist material and the etched substrate at the bottom of the second hole, thereby forming a continuous metal layer on the exposed portion of the substrate at the bottom of the second hole and discontinuous metal layers on the photoresist material covering the outer perimeter region of the first hole; and performing a liftoff process to remove both the photoresist material on the sidewalls of the second hole and the metal layers on the photoresist material to prevent the formation of metal stringers, while leaving the metal on the exposed portion of the substrate.

2. The method of claim 1 wherein the workpiece is a semiconductor.

3. The method of claim 1 wherein the workpiece is a plurality of epitaxially grown layers.

4. The method of claim 1 wherein the workpiece is a distributed Bragg reflector in a vertical cavity surface emitting laser.

5. The method of claim 1 further comprising the step of forming an electrical contact to the metal on the exposed portion of the substrate.

6. The method of claim 1 wherein the step of removing some photoresist material to form a second, smaller diameter hole includes the steps of
placing a mask on the photoresist, the mask defining a selected portion associated with a location for the second, smaller diameter hole;
exposing the masked photoresist material; and
removing exposed photoresist material to form the second hole.

7. The method of claim 6 wherein actinic radiation is used in the exposing step.

8. The method of claim 1 wherein the step of etching the substrate at the bottom of the second hole uses a wet chemical etching process to remove the portion of the substrate and to undercut the photoresist material covering the outer perimeter region of the first hole.

9. A method for forming an evaporated metal contact in a hole in a first distributed Bragg reflection (DBR) of a vertical cavity surface emitting laser (VCSEL) including the first DBR formed on a substrate, as well as an active region and a second DBR formed over the first DBR, the method including:
forming a first hole through the second DBR, the active region and the first DBR to expose a portion of the substrate;
depositing a photoresist material to cover a top major surface of the second DBR and also fill the first hole formed through the second DBR, the active region and the first DBR;
removing some of the photoresist material within the first hole to form a second hole of a smaller diameter within the first hole, using the steps of:
placing a mask on the photoresist, the mask defining a selected portion associated with a location for the second hole;
exposing the masked photoresist material; and
removing exposed photoresist material to form the second hole in which a portion of the substrate is exposed at the bottom of the second hole while leaving photoresist material covering a perimeter portion of the first hole;
wet chemical etching the substrate at the bottom of the second hole to remove a portion of the substrate and to undercut some of the photoresist material covering the perimeter portion of the first hole;
depositing a layer of contact metal on the photoresist material and the etched substrate at the bottom of the second hole, thereby forming a continuous metal layer on the exposed portion of the substrate at the bottom of the second hole and discontinuous metal layers on portions of the photoresist material covering the perimeter portion of the first hole; and
performing a liftoff process to remove both the vertical photoresist material on the sidewalls of the second hole and the metal layers on the photoresist material to prevent the formation of metal stringers, while leaving the metal on the exposed portion of the substrate.

10. The of method of claim 9 further comprising the step of forming an electrical contact to the metal on the exposed portion of the substrate.

11. The method of claim 9 wherein actinic radiation is used in the exposing step.

* * * * *